(12) United States Patent
Bhamidipati et al.

(10) Patent No.: US 9,268,892 B1
(45) Date of Patent: Feb. 23, 2016

(54) IDENTIFICATION OF UNKNOWN SOURCES FOR LOGIC BUILT-IN SELF TEST IN VERIFICATION

(71) Applicant: International Business Machines Corporation, Armonk, NY (US)

(72) Inventors: Satya R. S. Bhamidipati, Akividu (IN); Mary P. Kusko, Hopewell Junction, NY (US); Cedric Lichtenau, Stuttgart (DE); Srinivas V. N. Polisetty, Idupulapadu (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/577,582

(22) Filed: Dec. 19, 2014

(51) Int. Cl.
   *G06F 17/50* (2006.01)

(52) U.S. Cl.
   CPC ........ *G06F 17/5045* (2013.01); *G06F 17/5022* (2013.01)

(58) Field of Classification Search
   CPC ............ G06F 17/5022; G06F 17/5045; G06F 11/261; G06F 2217/14; G06F 11/27
   USPC ........... 716/100–103, 106, 136; 714/739, 742
   See application file for complete search history.

(56) References Cited

U.S. PATENT DOCUMENTS

| | | | |
|---|---|---|---|
| 6,591,402 B1* | 7/2003 | Chandra | G06F 17/5022 716/106 |
| 7,350,124 B2 | 3/2008 | Gloekler et al. | |
| 7,735,049 B2 | 6/2010 | Wang et al. | |
| 7,895,490 B2 | 2/2011 | Gass et al. | |
| 8,103,925 B2 | 1/2012 | Hapke et al. | |
| 8,166,360 B2 | 4/2012 | Koenemann et al. | |
| 2008/0016480 A1* | 1/2008 | Gass | G06F 17/5031 716/108 |
| 2014/0006889 A1 | 1/2014 | Motika et al. | |

OTHER PUBLICATIONS

Chickermane et al, "Channel Masking Synthesis for Efficient On-Chip Test Compression", ITC International Test Conference, Copyright 2004 IEEE, paper 15.3, pp. 452-461, <http://ieeexplore.ieee.org/xpl/articleDetailsjsp?tp=&arnumber=1386981&url=http%3A%2F%2Fieeexplore.ieee.org%2Fxpls%2Fabs_all.jsp%3Farnumber%3D1386981>.

Disclosed Anonymously, "A Novel Scheme for RTL Verification of Logic BIST Implementation in SoCs", IP.com Disclosure Number: IPCOM000207117D, Published May 17, 2011, <http://ip.com/IPCOM/000207117>.

* cited by examiner

*Primary Examiner* — Paul Dinh
(74) *Attorney, Agent, or Firm* — Maeve McCarthy

(57) ABSTRACT

A tool for determining unknown sources in a circuit design for exclusion from logic built-in self test (LBIST) verification for the circuit. The tool determines, by one or more computer processors, an initial nets list, wherein the initial nets list is a representation of a circuit design being tested. The tool initializes, by one or more computer processors, one or more nets contained in the initial nets list. The tool removes, by one or more computer processors, the one or more nets initialized in response to initialization of each of one or more latches in one or more test channels of the circuit design being tested. The tool determines, by one or more computer processors, whether a latch of the one or more latches is corrupted by an unknown source.

20 Claims, 6 Drawing Sheets

IDENTIFICATION OF UNKNOWN SOURCES FOR LOGIC BUILT-IN SELF TEST IN VERIFICATION

BACKGROUND OF THE INVENTION

The present invention relates generally to circuit verification, and more particularly to identifying unknown sources for logic built-in self test in verification.

Logic built-in self test (LBIST) is a test method that executes a main test loop of a chip (circuit) with minimal dependences on an external tester. This approach of testing uses a pseudo random pattern generator (PRPG) to provide a pattern stimulus, and a multi input signature register (MISR) to capture a response. An on product clock generator (OPCG) logic generates a clock sequence for testing. The PRPG generates a test pattern that is applied into the LBIST scan channels via a scan. The response from the scan channels after a capture clock sequence is compressed in MISR(s), which is generally termed a signature. Once the chip is initialized, only a reference clock is needed from the test equipment or circuit board, therefore MISR(s) have an advantage of efficiently compressing the response data. To have a well defined signature in a MISR at the end of a test, all response data collected into the MISR must be predictable, and as such, there cannot be any X-states in the chip going to a MISR. For example, where there is a timing sensitive path that gives a deterministic response only after two cycles, this would be considered an X (i.e., an unknown) for one cycle tests, and must be blocked from being captured into a MISR.

SUMMARY

Aspects of an embodiment of the present invention disclose a method, system, and computer program product for determining unknown sources in a circuit design for exclusion from logic built-in self test (LBIST) verification for the circuit. The method includes determining, by one or more computer processors, an initial nets list, wherein the initial nets list is a representation of a circuit design being tested. The method includes initializing, by one or more computer processors, one or more nets contained in the initial nets list. The method includes removing, by one or more computer processors, the one or more nets initialized in response to initialization of each of one or more latches in one or more test channels of the circuit design being tested. The method includes determining, by one or more computer processors, whether a latch of the one or more latches is corrupted by an unknown source.

DETAILED DESCRIPTION

Embodiments of the present invention recognize that state of the art methods for verification relying on various text-based and formal design specifications to identify an X (unknown) source are not fully representative of the unknown logic and are inaccurately translated to test cases and models resulting in test and coverage escape for part of a circuit's logic. Embodiments of the present invention further recognize that setting all latches in a design to X (unknown state) for simulation does not cover special X-state cases, such as analog components that are not deterministic, or arrays that are made of memory cells instead of latches, or control logic driving the test that can not be set to X, but is nevertheless not contributing predictable values.

Embodiments of the present invention provide the capability to identify pre-silicon all unknown sources that could contribute to an unstable signature and cover a plurality of special X-state cases. Embodiments of the present invention provide the capability to utilize nets/signals in a chip (electronic circuit) and special properties of various latches in the chip's design to identify the unknown sources that could contribute to an unstable signature test methods compressing test results into a signature, including, but not limited to, LBIST.

Implementation of such embodiments may take a variety of forms, and exemplary implementation details are discussed subsequently with reference to the Figures.

As will be appreciated by one skilled in the art, aspects of the present invention may be embodied as a method or system. Accordingly, aspects of the present invention may take the form of an entirely hardware embodiment, an entirely software embodiment (including firmware, resident software, micro-code, etc.), or an embodiment combining software and hardware aspects that may all generally be referred to herein as a "circuit," "module," or "system." Furthermore, aspects of the present invention may take the form of a computer program product embodied in one or more computer-readable media having computer readable program code/instructions embodied thereon.

Figure 1:
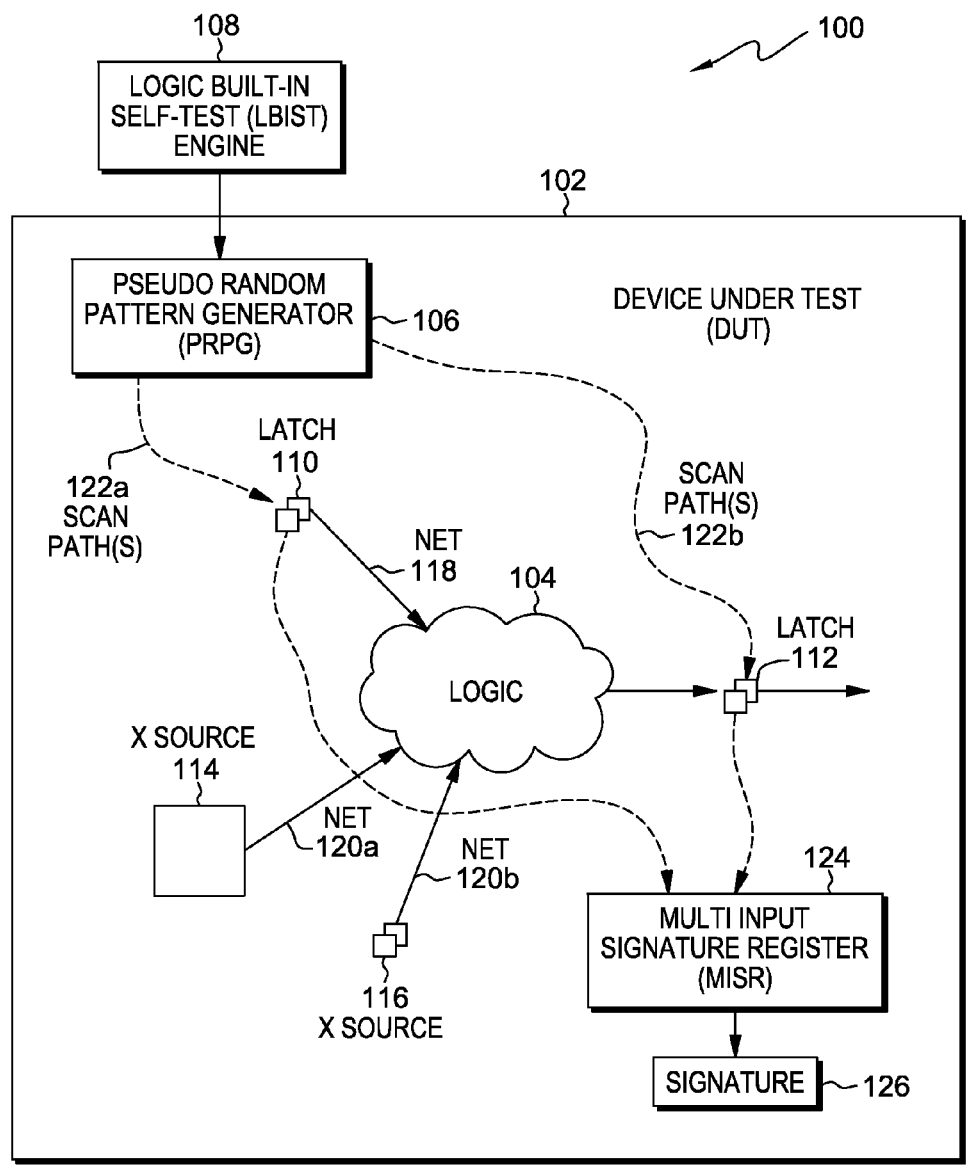
FIG. 1 is a function block diagram illustrating a portion of a data processing system, generally designated 100, in accordance with an embodiment of the present invention.

The present invention will now be described in detail with reference to the Figures. FIG. 1 illustrates an exemplary data processing system 100 incorporating certain components for identifying unknown sources for logic built-in self-test verification. In the exemplary embodiment, data processing system 100 may be implemented in a plurality of processor architectures that issue and execute instructions, such as single or multi-core microprocessors or micro controllers. Data processing system 100 includes a device under test (DUT) 102.

Generally, DUT 102 represents a chip (circuit) to be verified. Many modern circuits include a plurality of scan paths, and as such, DUT 102 includes a plurality of scan paths, such as scan path(s) 122a and 122b. Data processing system 100 applies an LBIST test pattern to DUT 102, which generates a plurality of LBIST patterns, applying the plurality of LBIST patterns to scan path(s) 122a and 122b. Multi input signature register (MISR) 124 compresses each output from logic 104 resulting from the LBIST patterns into a signature, such as signature 126, for verification.

In the exemplary embodiment, data processing system 100 includes a logic built-in self-test (LBIST) engine 108. In the exemplary embodiment, LBIST 108 is an otherwise conventional LBIST engine. LBIST engine 108 generates an LBIST test pattern based, at least in part, on user input. In one embodiment, LBIST engine 108 includes a plurality of LBIST components, such as a controller, for determining unpredictable elements in an electronic circuit under test, such as DUT 102, for exclusion from LBIST verification.

In the exemplary embodiment, DUT 102 includes a pseudo random pattern generator (PRPG) 106. PRPG 106 is an otherwise conventional pseudo random pattern generator, configured to generate a plurality of ordered pseudo random LBIST test patterns in response to an LBIST test pattern received from LBIST engine 108. Generally, the LBIST test patterns generated by PRPG 106 are configured, collectively, to test for a wide variety of problems and faults in logic 104. For convenience, as used herein, "LBIST test patterns" means the pseudo random patterns generated by PRPG 106 in response to an LBIST test pattern.

In the exemplary embodiment, DUT 102 includes MISR 124 for compressing output into a data signature. MISR 124 is an otherwise conventional multi input signature register or any other suitable data compactor. In one embodiment, MISR 124 can be fully integrated, partially integrated, or separate from DUT 102. MISR 124 receives raw output from logic 104 (resulting from LBIST pattern stimuli), and compresses the raw output into a signature, such as signature 126. There are a variety of well known approaches to compacting raw output into a signature.

In the exemplary embodiment, DUT 102 includes a signature 126. Generally, signature 126 is an otherwise conventional signature file, and can comprise a storage structure, hardware storage, an abstract data structure, or other suitable configuration. In one embodiment, signature 126 stores a known good signature output for each test pattern applied to logic 104. In an alternate embodiment, signature 126 stores a plurality of known good signature outputs for a plurality of LBIST patterns.

In the exemplary embodiment, LBIST engine 108 applies an LBIST pattern to logic 104, from which PRPG 106 generates LBIST patterns for one or more scan paths, such as scan path(s) 122a and 122b. Logic 104 provides an output to MISR 124, which compresses the raw output data into signature 126.

In the exemplary embodiment, a latch or memory element, such as latch 110 and 112 that is connected along one or more scan paths to MISR 124, such as scan path(s) 122a and 122b respectively, contribute to signature 126. In order for a signature, such as signature 126, to be stable, each latch, such as latch 110 and 112 must be known and predictable. One or more nets, such as net 118, 120a, and 120b are functional paths contributing to logic 104. In the exemplary embodiment, net 118 is initialized by PRPG 106 in a same clock domain as latch 112 (i.e., it is driven by latch 110 fed by PRPG 106 along scan path 122a), and as such, is considered a known source. In the exemplary embodiment, net 120a and 120b are not initialized by PRPG 106 in the same clock domain as latch 112, and as such, are treated as an X source (i.e., unknown source) for LBIST. LBIST engine 108 determines all possible nets, such as net 120a and 120b, originating from an unknown source, such as X source 114 and X source 116, respectively, that are contributing to logic, such as logic 104, of elements under test, such as latch 112, that are collected into MISR 124.

In the exemplary embodiment, X source 114 and X source 116 are unknown sources that, when contributing to a MISR signature during LBIST verification, render the signature unstable. X source 114 and X source 116 can include, without limitation, typical unknown sources such as arrays, analog components, clock domain crossings, phase locked loop complexes (PLLs), and on-product clock generator blocks (OPCGs).

In one embodiment, a latch, such as latch 112 can be included in more than one group of latches. For example, latch 112 contributing to signature 126 is generally also initialized during verification by PRPG 106 similar to latch 110. In one embodiment latch 110 and latch 112 can include groups of latches. For example, latch 110 can represent a group of latches initialized by PRPG 106.

Data processing system (DPS) 100 may include additional components, such as LBIST engines, MISRs, PRPGs, controllers, scan paths, latches, X sources, combinatorial logic, etc., not depicted in FIG. 1.

Figure 2:
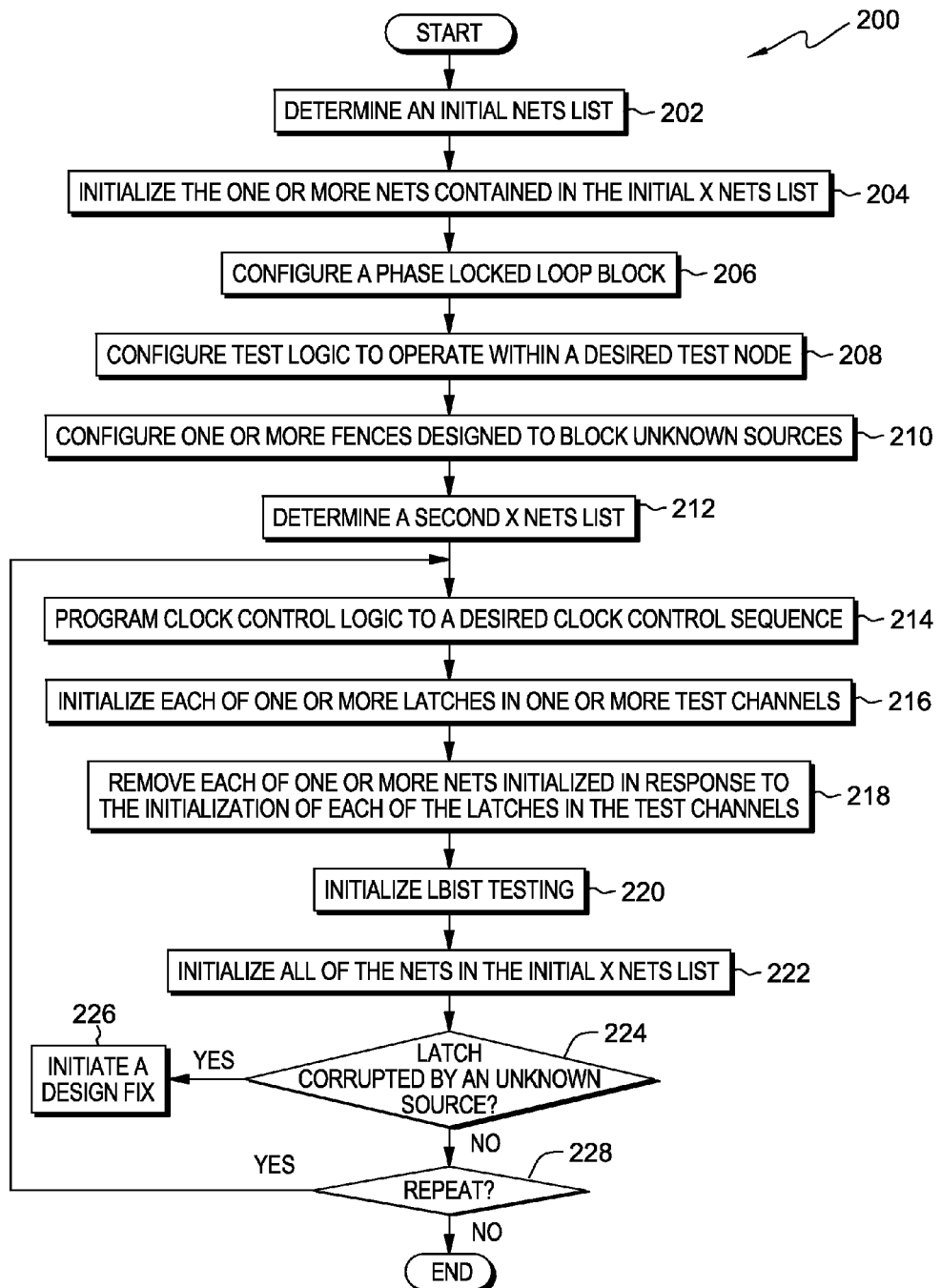
FIG. 2 is a flowchart depicting the steps of a simulation method for determining unknown sources in a circuit within a data processing system (such as data processing system 100) for exclusion from LBIST verification, generally designated 200, in accordance with an embodiment of the present invention.

FIG. 2 is a flowchart depicting logical operational steps of a simulation method performed by, for example, DPS 100, for determining unknown sources in a circuit for exclusion from LBIST verification, generally designated 200, in accordance with an embodiment of the present invention.

DPS 100 determines an initial nets list (202). In the exemplary embodiment, DPS 100 determines an initial nets list by collecting each of one or more nets within a circuit design being tested (i.e., verified), and compiling the collected nets in the initial nets list. For example, DPS 100 collects each of the one or more nets, such as net 118, net 120a, and net 120b, within the circuit design of a circuit under test, such as DUT 102, and compiles the one or more nets in the initial nets list. The initial nets list contains both known sources and X sources, and can be a gate-level net list, or an intermediate net list produced for simulation, representative of the circuit design being tested.

DPS 100 initializes the one or more nets contained in the initial nets list, where initializing each of the one or more nets includes configuring each of the one or more nets as an unknown source (204). For example DPS 100 initializes net 118, net 120(a), and net 120(b) by configuring each of the nets as an X (unknown) source.

DPS 100 configures a phase locked loop (PLL) block for a desired system clock frequency (206), and hence removes the initialization to X from the associated nets in DUT 102, such as net 118, net 120(a), and net 120(b). For example, where X source 114 was part of the PLL, net 120(a) is now driven by X source 114 and the X (unknown) value is removed from that net.

DPS 100 configures test logic to operate within a desired test mode (208). In the exemplary embodiment, DPS 100 configures the test logic to operate with LBIST testing. For example, nets driven by PRPG 106, such as net 118, are no longer configured at an X (unknown) value.

DPS 100 configures one or more fences designed to block unknown sources (210). In the exemplary embodiment, DPS 100 configures one or more fences, such as control latches, gates, etc., to block unknown sources, such that outputs of the fences are free of X (i.e., free of unknown sources and well defined).

DPS 100 determines a second nets list (212). In the exemplary embodiment, DPS 100 determines the second nets list by collecting each of one or more nets that are now free of unknown sources after step 208 and 210 (i.e., the fenced nets and the outputs of the fenced nets), and removing each of the one or more nets that are free of unknown sources from the initial nets list, thereby avoiding consideration of nets that are known to be defined for X (unknown) source detection.

DPS 100 programs clock control logic to a desired clock control sequence (214). In the exemplary embodiment, DPS 100 programs the clock control logic to a desired clock control sequence for LBIST testing, wherein the desired clock control sequence is determined by a circuit's (i.e., device under test) design and conventional simulation procedures.

DPS 100 initializes each of one or more latches in one or more test channels (216). In the exemplary embodiment, DPS 100 initializes each of the one or more latches, such as latch 110 and latch 112, in the one or more test channels, such as scan path(s) 122a and 122b, respectively, by PRPG scan loading or parallel loading of latches using conventional verification environment capabilities.

DPS 100 removes each of the one or more nets initialized in response to the initialization of each of the one or more latches in the one or more test channels (218). In the exemplary embodiment, DPS 100 removes each of the one or more nets initialized such that the initial nets list contains all the probable unknown sources for the logic under test. For example, DPS 100 removes net 118 from the X net list.

DPS 100 initializes LBIST testing (220). In the exemplary embodiment, DPS 100 initializes, for example, an on product clock generator engine (OPCG) for LBIST testing to analyze the circuit design and determine whether the MISR signature, such as signature 126, is corrupted with X sources.

DPS 100 initializes all of the nets in the initial nets list, setting the nets to X (i.e., unknown) sources just prior to a capture phase of the LBIST testing (222).

DPS 100 determines whether any latch in the LBIST scan path(s), such as scan path(s) 122a and 122b, feeding a MISR, such as MISR 124, is corrupted with an X source (224). In the exemplary embodiment, DPS 100 determines whether any latch in the LBIST scan path(s) is corrupted with an X source by determining if a latch, such as latch 110 and 112, or X source 114 and 116, contributing to a MISR signature, such as signature 126, is an unknown source. For example, in the case where a latch, such as X source 116, is contributing a MISR signature, DPS 100 may determine that X source 116 is in fact an unknown source corrupting the MISR signature. In another example, in the case where a latch, such as latch 110, is contributing to a MISR signature, DPS 100 may determine that latch 110 is in fact a known source, as it originates from a PRPG, such as PRPG 106, and therefore is not corrupting the MISR signature.

In the case where DPS 100 determines that a latch contributing to a MISR signature is an unknown source (YES branch, 224), DPS 100 initiates a design fix mechanism to block the unknown source(s) (226). The design fix mechanism is subsequently discussed in further detail in reference to FIG. 5.

In the exemplary embodiment, where DPS 100 determines that no latch contributing to the MISR signature is an unknown sources (NO branch, 224) (i.e., verification of the design is achieved using a simulation model), DPS 100 iterates steps 214-224 multiple times using different clock sequences and test patterns to have enough randomness for logic 100 to propagate X sources to the input of one or more latches (228).

Figure 3:
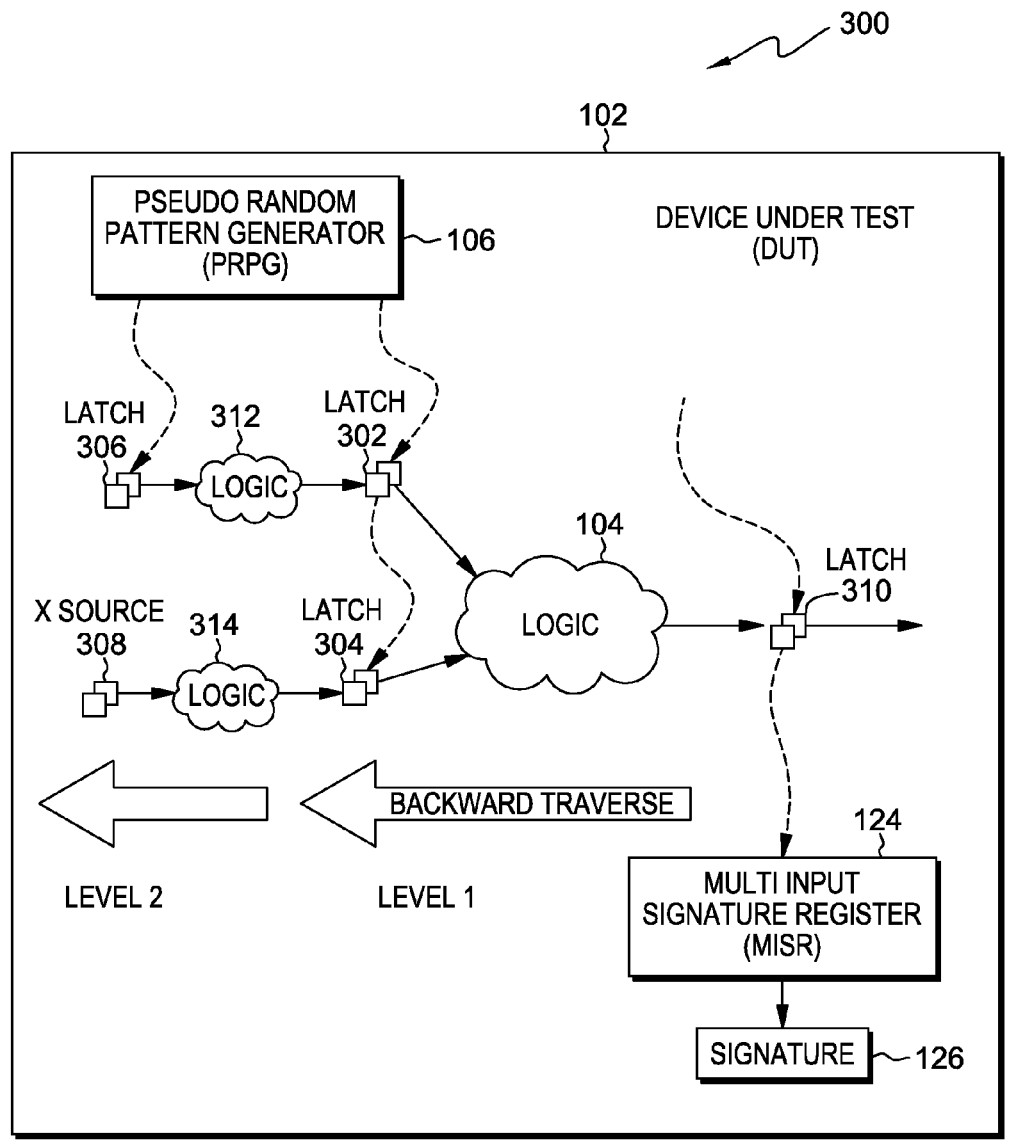
FIG. 3 is an alternative view of FIG. 1, illustrating an exemplary multi-cycle functional capture clock sequence in a circuit within a data processing system (such as data processing system 100), generally designated 300, in accordance with an embodiment of the present invention.

FIG. 3 is an alternative view of FIG. 1, illustrating an exemplary multi-cycle functional capture clock sequence in a circuit within a data processing system (such as data processing system 100), generally designated 300, in accordance with an embodiment of the present invention.

In the exemplary embodiment, a test sequence may contain more than one functional capture clocks to test multi-cycle paths. In the case of a test sequence with two or more functional capture clocks, a trace back of two or more levels of latches and/or memory elements in the logic path is necessary to determine all X sources in the given test pattern.

In the exemplary embodiment, a two functional capture clock sequence is depicted, including latch 302, latch 304, latch 306, x source 308, and latch 310. Latches 302, 304, and 306 are each known sources since each latch is driven from a PRPG, such as PRPG 106, for one functional capture clock sequence. If two functional capture clocks are applied, then it becomes necessary to traverse back one level of logic to, for example, logic 312 and logic 314, contributing to latches 302 and 304 respectively. Latch 302 is driven by another known value, i.e., latch 306, and therefore remains a known source for a two functional clocks sequence. In contrast, latch 304 is driven by at least the x source 308, and as such, latch 304 becomes an X (unknown) source itself for the two functional clocks sequence. In the exemplary embodiment, backward traversing can occur for one or more levels of logic, such as level 1 and level 2 depicted in FIG. 3, depending on a number of cycle paths and a level or accuracy in verification of a design.

Figure 4:
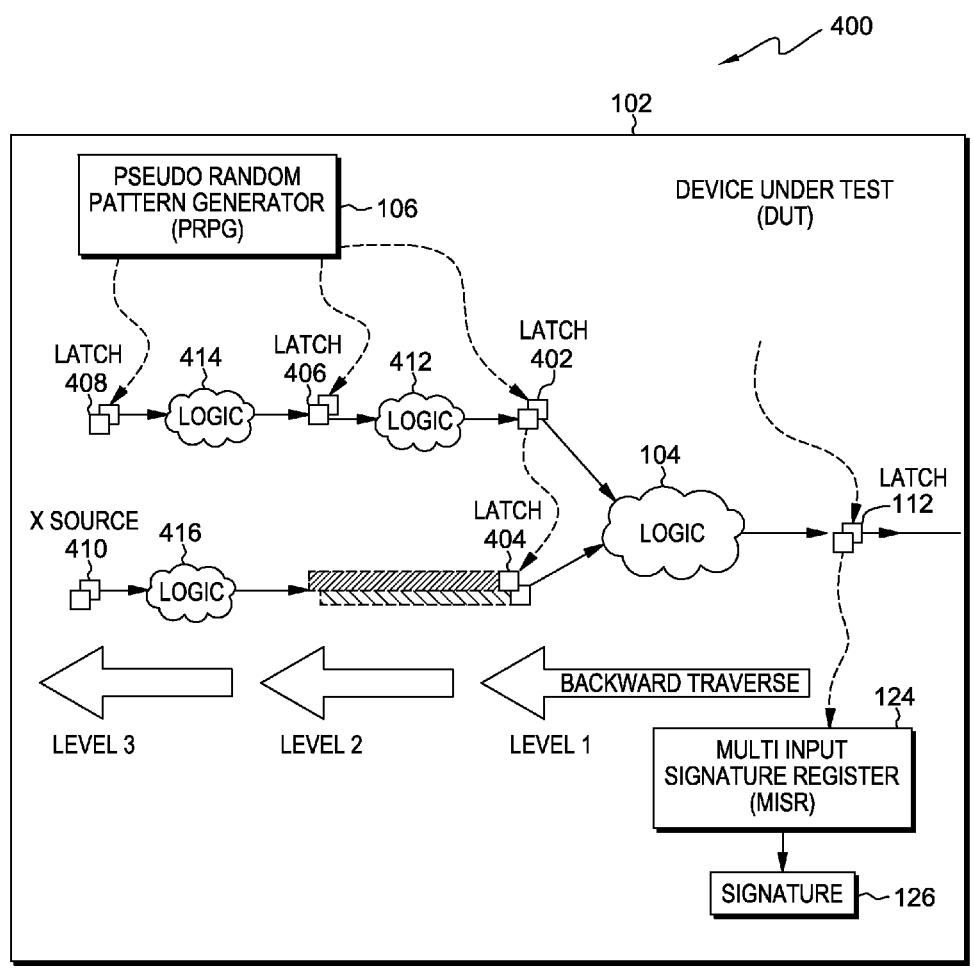
FIG. 4 is an alternative view of FIG. 1, illustrating a functional capture clock sequence with latches configured at a n:1 ratio in a circuit within a data processing system (such as data processing system 100), generally designated 400, in accordance with an embodiment of the present invention.

FIG. 4 is an alternative view of FIG. 1, illustrating a functional capture clock sequence with latches configured at a n:1 ratio in a circuit within a data processing system (such as data processing system 100), generally designated 400, in accordance with an embodiment of the present invention.

In the exemplary embodiment, the simulation method discuss above in FIG. 2 and FIG. 3 can be extended to latches operating at a n:1 ratio (i.e., latches that are clocked once every n cycles). Such latches are stable for n functional capture clocks, as they are not clocked more often. For example, as depicted in FIG. 4, in a group of latches, including latch 402, latch 406, and latch 408 operating at 1:1 ratio (full frequency), latch 404 operating at 2:1 ratio, and an X source 410, latch 404 is stable for one backward traversal level (e.g., level 1 of FIG. 4) before it is clocked and captures the X source 410 value, and latch 402 is stable for two functional capture clocks (e.g., level 2 of FIG. 4), as each latch is a known source driven from PRPG 106. In the exemplary embodiment, latch 112 will only be corrupted where at least three functional capture clocks (e.g., level 3 of FIG. 4) are applied during LBIST testing.

In another embodiment, a full structural analysis of a design at gate level can be used to determine whether all latches contributing to a MISR signature are known sources (i.e., stable). Similarly, a net list of all latches that are set to a known value by a PRPG can be identified by a full structural analysis of the design. Finally, a full structural analysis of a logic back cone (i.e., logic) of all latches of a known source can be done to determine whether any other sources, such as unknown sources, can be reached in a n level, where n is a number of functional capture clocks of a test sequence. For example, if a discovered source is not a known source, for example, the discovered source is an X source, then the signature will not be stable and the design must be modified to fix this problem.

In yet another embodiment, a half structural analysis of a design at gate level, using steps 202-212 of the simulation method described in FIG. 2, is performed to generate a net list. In response to generating the net list, DPS 100 performs a structural analysis of the net list at a gate level to traverse backward from each of the latches in a group of latches to determine whether a latch hits a net/latch contained in the net list. In the case where a latch hits a net/latch contained in the net list, it can be inferred that a MISR signature will not be stable.

Figure 5:
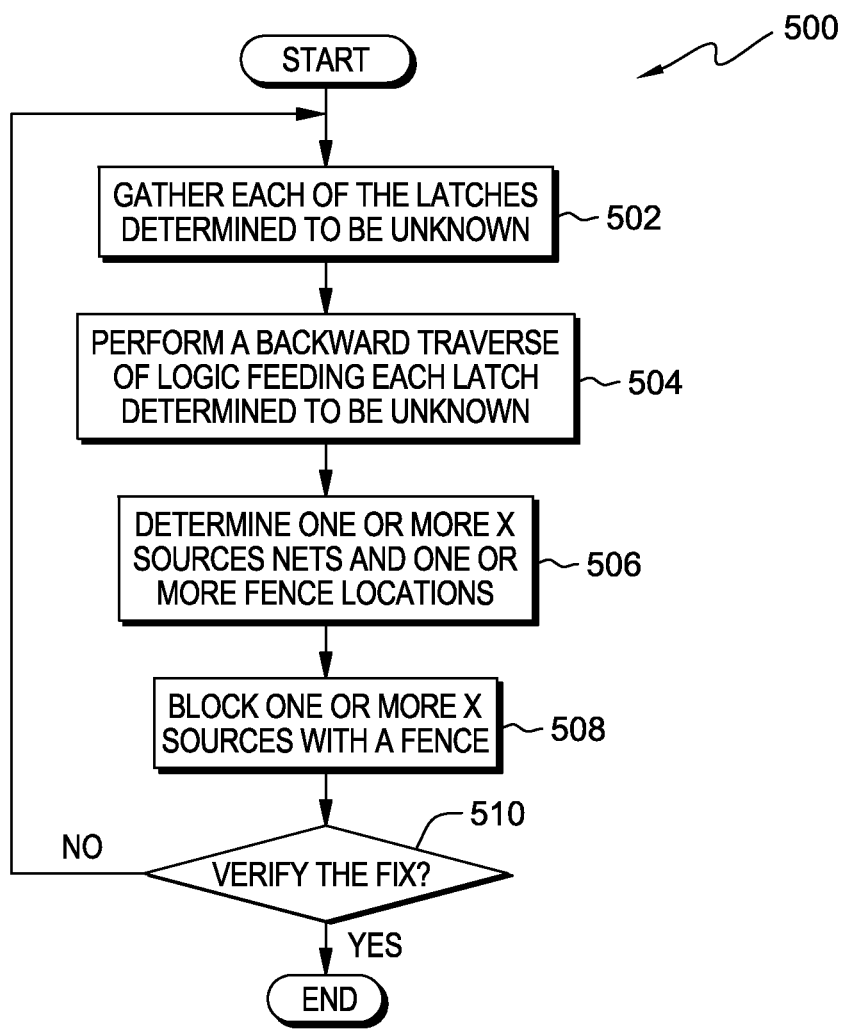
FIG. 5 is a flowchart depicting the steps of a method for inserting missing fencing of X sources to achieve a stable test signature for LBIST in a circuit within a data processing system (such as data processing system 100), generally designated 500, in accordance with an embodiment of the present invention.

FIG. 5 is a flowchart depicting the steps of a method for inserting missing fencing of X sources to achieve a stable test signature for LBIST in a circuit within a data processing system (such as data processing system 100), generally designated 500, in accordance with an embodiment of the present invention.

DPS 100 gathers as input each of the latches determined to be unknown in step 224 of FIG. 2 (502). In the exemplary embodiment, DPS 100 gathers as input each of the latches by generating a list of test participating latches that are determined to be an X source (i.e., unknown) after a capture clock phase.

DPS 100 performs a backward traverse of logic feeding each of the latches that are determined to be an X source (504). In the exemplary embodiment, DPS 100 performs a trace back of the logic feeding each latch in the design determined to be an X source as previously described in FIGS. 3 and 4.

DPS 100 determines one or more X source nets and one or more fence (i.e., gate) locations (506). In the exemplary embodiment, DPS 100 determines one or more X source nets for each of the latches that are determined to be an X source, wherein the one or more X source nets are functional paths from the X source to the logic. In the exemplary embodiment, DPS 100 determines the one or more fence locations for each of the latches that are determined to be an X source, wherein the one or more fence locations are on the one or more X source nets.

DPS 100 blocks one or more X sources with a fence (508). In the exemplary embodiment, DPS 100 blocks the one or more X sources with a fence by placing a fence on the one or more X source nets associated with the one or more X sources.

DPS 100 repeat steps 202-212, as described in FIG. 2, to verify the fix (510). In the exemplary embodiment, DPS 100 performs steps 202-212 again to determine that a fence on one or more X source nets associated with an X source actually blocks the X source from contributing to a MISR signature. If DPS 100 verifies that the fence eliminates the X source from the MISR signature (YES branch, 510), then the fix is successful. If DPS 100 cannot verify that the fence blocked the X source from the MISR signature (NO branch, 510) (i.e., the X source still contributes to the MISR signature), then DPS 100 repeats steps 502-510 to eliminate the X source from the MISR signature.

Figure 6:
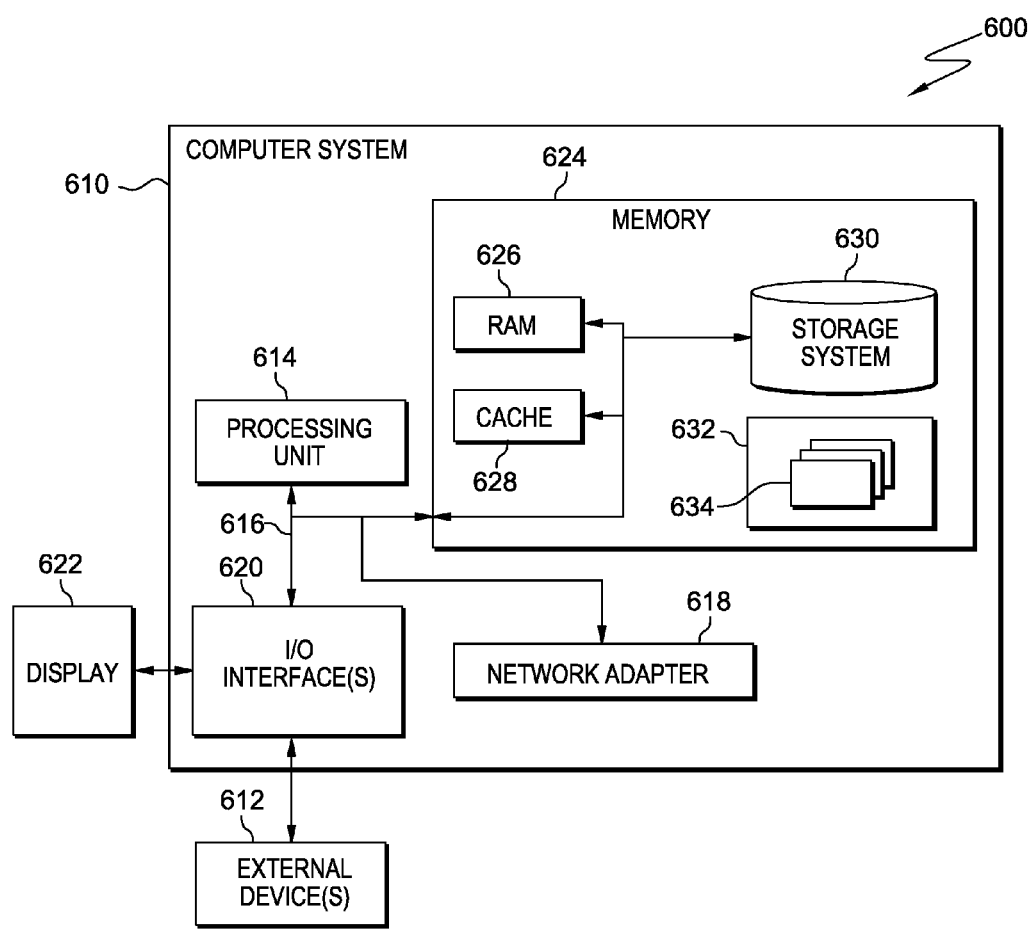
FIG. 6 is a block diagram of components of a data processing system (such as data processing system 100), generally designated 600, depicted in accordance with the present invention.

FIG. 6 is a block diagram of components of a data processing system (such as data processing system 100), generally designated 600, depicted in accordance with the present invention.

FIG. 6 depicts a block diagram of components of a data processing system, such as data processing system 100, in accordance with an illustrative embodiment of the present invention. It should be appreciated that FIG. 6 provides only an illustration of one implementation and does not imply any limitations with regard to the environments in that different embodiments may be implemented. Many modifications to the depicted environment may be made.

In the illustrative embodiment, data processing system 100 is shown in the form of a general-purpose computing device. The components of computer system 610 may include, but are not limited to, at least one processor or processing unit 614, a system memory 624, and a bus 616 that couples various system components including system memory 624 to processing unit 614.

Bus 616 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system 610 typically includes a variety of computer system readable media. Such media may be any available media that is accessible by computer system 610, and it includes both volatile and non-volatile media, removable and non-removable media.

System memory 624 can include computer system readable media in the form of volatile memory, such as random access memory (RAM) 626 and/or cache memory 628. Computer system 610 may further include other removable/non-removable, volatile/non-volatile computer system storage media. By way of example only, storage system 630 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM, or other optical media can be provided. In such instances, each can be connected to bus 616 by one or more data media interfaces. As will be further depicted and described below, system memory 624 may include at least one computer program product having a set (e.g., at least one) of program modules that are configured to carry out the functions of embodiments of the invention.

Program/utility 632, having one or more sets of program modules 634, may be stored in memory 624 by way of example, and not limitation, as well as an operating system, one or more application programs, other program modules, and program data. Each of the operating systems, one or more application programs, other program modules, and program data, or some combination thereof, may include an implementation of a networking environment. Program modules 634 generally carry out the functions and/or methodologies of embodiments of the invention as described herein. Computer system 610 may also communicate with one or more external device(s) 612 such as a keyboard, a pointing device, a display 622, etc., or one or more devices that enable a user to interact with computer system 610 and any devices (e.g., network card, modem, etc.) that enable computer system 610 to communicate with one or more other computing devices. Such communication can occur via Input/Output (I/O) interface(s) 620. Still yet, computer system 610 can communicate with one or more networks such as a local area network (LAN), a general wide area network (WAN), and/or a public network (e.g., the Internet) via network adapter 618. As depicted, network adapter 618 communicates with the other components of computer system 610 via bus 616. It should be understood that although not shown, other hardware and software components, such as microcode, device drivers, redundant processing units, external disk drive arrays, RAID systems, tape drives, and data archival storage systems may be used in conjunction with computer system 610.

The present invention may be a system, a method, and/or a computer program product. The computer program product may include a computer readable storage medium (or media) having computer readable program instructions thereon for causing a processor to carry out aspects of the present invention.

The computer readable storage medium can be any tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention can be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, a special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the block can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

The terminology used herein is for the purpose of describing particular embodiments only and is not intended to be limiting of the invention. It should be appreciated that any particular nomenclature herein is used merely for convenience and thus, the invention should not be limited to use solely in any specific function identified and/or implied by such nomenclature. Furthermore, as used herein, the singular forms of "a", "an", and "the" are intended to include the plural forms as well, unless the context clearly indicates otherwise.

What is claimed is:

1. A method for determining unknown sources in a circuit design for exclusion from logic built-in self test (LBIST) verification for the circuit, the method comprising:
   determining, by one or more computer processors, an initial nets list, wherein the initial nets list is a representation of a circuit design being tested;
   initializing, by one or more computer processors, one or more nets contained in the initial nets list;
   removing, by one or more computer processors, the one or more nets initialized in response to initialization of each of one or more latches in one or more test channels of the circuit design being tested; and
   determining, by one or more computer processors, whether a latch of the one or more latches is corrupted by an unknown source.

2. The method of claim 1, wherein determining an initial nets list, further comprises collecting, by one or more computer processors, each of one or more nets within the circuit design being tested, wherein the one or more nets include both known sources and unknown sources.

3. The method of claim 1, wherein initializing one or more nets contained in the initial nets list, further comprises configuring, by one or more computer processors, each of the one or more nets as an unknown source.

4. The method of claim 1 further comprises:
   determining a second nets list, wherein determining the second nets list includes collecting each of one or more nets that are free of unknown sources; and
   removing, by one or more computer processors, each of the one or more nets that are free of unknown sources from the initial nets list to avoid consideration of those known sources during unknown source detection.

5. The method of claim 4 further comprises:
   configuring, by one or more computer processors, test logic to operate within a desired test mode;
   configuring, by one or more computer processors, one or more fences designed to block unknown sources, such that an output of the one or more fences is free of unknown sources; and
   collecting, by one or more computer processors, each of the one or more nets that is the output of the one or more fences.

6. The method of claim 1, wherein removing the one or more nets initialized in response to initialization of each of one or more latches in one or more test channels, further comprises initializing, by one or more computer processors, each of the one or more latches in the one or more test channels using conventional verification environment capabilities.

7. The method of claim 1, wherein determining that a latch of the one or more latches is corrupted by an unknown source, further comprises initializing, by one or more computer processors, all of the nets in the initial nets list, and setting the nets to unknown sources prior to a capture phase of LBIST testing.

8. The method of claim 1 further comprises, responsive to determining that a latch of the one or more latches is corrupted by an unknown source, initiating, by one or more computer processors, a design fix mechanism to block the unknown source.

9. The method of claim 8 further comprises:
   gathering, by one or more computer processors, each of the one or more latches determined to be an unknown source after a capture clock phase;
   performing, by one or more computer processors, a backward traverse of logic feeding each of the one or more latches determined to be an unknown source;
   determining, by one or more computer processors, one or more unknown source nets and one or more fence locations for each of the one or more latches determined to be an unknown source;
   blocking, by one or more computer processors, each of the one or more latches by using a fence on one or more unknown source nets associated with each of the one or more latches; and
   verifying, by one or more computer processors, that the fence on the one or more unknown source nets associated with each of the one or more latches blocked the unknown source from contributing to the test signature.

10. A computer program product for determining unknown sources in a circuit design for exclusion from logic built-in self test (LBIST) verification for the circuit, the computer program product comprising:
    one or more computer readable storage media and program instructions stored on the one or more computer readable storage media, the program instructions comprising:
    program instructions to determine, by one or more computer processors, an initial nets list, wherein the initial nets list is a representation of a circuit design being tested;
    program instructions to initialize, by one or more computer processors, one or more nets contained in the initial nets list;
    program instructions to remove, by one or more computer processors, the one or more nets initialized in response to initialization of each of one or more latches in one or more test channels of the circuit design being tested; and
    program instructions to determine, by one or more computer processors, whether a latch of the one or more latches is corrupted by an unknown source.

11. The computer program product of claim 10, wherein program instructions to determine an initial nets list, further comprises program instructions to collect, by one or more computer processors, each of one or more nets within the circuit design being tested, wherein the one or more nets include both known sources and unknown sources.

12. The computer program product of claim 10, wherein program instructions to initialize one or more nets contained in the initial nets list, further comprises program instructions to configure, by one or more computer processors, each of the one or more nets as an unknown source.

13. The computer program product of claim 10 further comprises:
    program instructions to determine a second nets list, wherein determining the second nets list includes collecting each of one or more nets that are free of unknown sources; and program instructions to remove, by one or more computer processors, each of the one or more nets that are free of unknown sources from the initial nets list to avoid consideration of those known sources during unknown source detection.

14. The computer program product of claim 13 further comprises:
    program instructions to configure, by one or more computer processors, test logic to operate within a desired test mode;
    program instructions to configure, by one or more computer processors, one or more fences designed to block unknown sources, such that an output of the one or more fences is free of unknown sources; and
    program instructions to collect, by one or more computer processors, each of the one or more nets that is the output of the one or more fences.

15. The computer program product of claim 10, wherein program instructions to remove the one or more nets initialized in response to initialization of each of one or more latches in one or more test channels, further comprises program instructions to initialize, by one or more computer processors, each of the one or more latches in the one or more test channels using conventional verification environment capabilities.

16. The computer program product of claim 10, wherein program instructions to determine whether a latch of the one or more latches is corrupted by an unknown source, further comprises initializing, by one or more computer processors, all of the nets in the initial nets list, and setting the nets to unknown sources prior to a capture phase of LBIST testing.

17. The computer program product of claim 10 further comprises, responsive to determining that a latch of the one or more latches is corrupted by an unknown source, program instructions to initiate, by one or more computer processors, a design fix mechanism to block the unknown source.

18. The computer program product of claim 17 further comprises:
    program instructions to gather, by one or more computer processors, each of the one or more latches determined to be an unknown source after a capture clock phase;
    program instructions to perform, by one or more computer processors, a backward traverse of logic feeding each of the one or more latches determined to be an unknown source;
    program instructions to determine, by one or more computer processors, one or more unknown source nets and one or more fence locations for each of the one or more latches determined to be an unknown source;
    program instructions to block, by one or more computer processors, each of the one or more latches by using a fence on one or more unknown source nets associated with each of the one or more latches; and
    program instructions to verify, by one or more computer processors, that the fence on the one or more unknown source nets associated with each of the one or more latches blocked the unknown source from contributing to the test signature.

19. A computer system for determining unknown sources in a circuit design for exclusion from logic built-in self test (LBIST) verification for the circuit, the computer system comprising:
    one or more computer readable storage media;
    program instructions stored on at least one of the one or more computer readable storage media for execution by at least one of the one or more computer processors, the program instructions comprising:
    program instructions to determine, by one or more computer processors, an initial nets list, wherein the initial nets list is a representation of a circuit design being tested;
    program instructions to initialize, by one or more computer processors, one or more nets contained in the initial nets list;
    program instructions to remove, by one or more computer processors, the one or more nets initialized in response to initialization of each of one or more latches in one or more test channels of the circuit design being tested; and
    program instructions to determine, by one or more computer processors, whether a latch of the one or more latches is corrupted by an unknown source.

20. The computer system of claim 19 further comprises, responsive to determining that a latch of the one or more latches is corrupted by an unknown source, program instructions to initiate, by one or more computer processors, a design fix mechanism to block the unknown source.

* * * * *